(12) United States Patent
Bojkov et al.

(10) Patent No.: US 10,855,240 B2
(45) Date of Patent: Dec. 1, 2020

(54) STRUCTURES FOR SPATIAL POWER-COMBINING DEVICES

(71) Applicant: Qorvo US, Inc., Greensboro, NC (US)

(72) Inventors: Christo Bojkov, Plano, TX (US);
Dylan Murdock, Bend, OR (US);
Robert Charles Dry, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/191,541

(22) Filed: Nov. 15, 2018

(65) Prior Publication Data
US 2020/0162046 A1   May 21, 2020

(51) Int. Cl.
| | |
|---|---|
| *H03F 3/60* | (2006.01) |
| *H01P 5/12* | (2006.01) |
| *H01Q 3/42* | (2006.01) |
| *H01Q 3/22* | (2006.01) |
| *H01Q 9/28* | (2006.01) |

(52) U.S. Cl.
CPC .............. *H03F 3/602* (2013.01); *H01P 5/12* (2013.01); *H01Q 3/22* (2013.01); *H01Q 3/42* (2013.01); *H01Q 9/28* (2013.01)

(58) Field of Classification Search
USPC .............................. 330/124 R, 295, 289, 307
See application file for complete search history.

(56) References Cited

U.S. PATENT DOCUMENTS

| | | |
|---|---|---|
| 3,023,382 A | 2/1962 | Borghetti |
| 4,234,854 A | 11/1980 | Schellenberg et al. |
| 4,424,496 A | 1/1984 | Nichols et al. |
| 5,036,335 A | 7/1991 | Jairam |
| 5,162,803 A | 11/1992 | Chen |
| 5,214,394 A | 5/1993 | Wong |
| 5,256,988 A | 10/1993 | Izadian |
| 5,736,908 A | 4/1998 | Alexanian et al. |
| 5,920,240 A | 7/1999 | Alexanian et al. |
| 6,028,483 A | 2/2000 | Shealy et al. |

(Continued)

FOREIGN PATENT DOCUMENTS

WO   2017214357 A2   12/2017

OTHER PUBLICATIONS

Non-Final Office Action for U.S. Appl. No. 15/933,821, dated Jul. 11, 2019, 7 pages.

(Continued)

*Primary Examiner* — Hieu P Nguyen
(74) *Attorney, Agent, or Firm* — Withrow & Terranova, P.L.L.C.

(57) ABSTRACT

Improved structures for spatial power-combining devices are disclosed. A spatial power-combining device includes a plurality of amplifier assemblies and each amplifier assembly includes a body structure that supports an input antenna structure, an amplifier, and an output antenna structure. According to embodiments disclosed herein, the body structure comprises a material that is configured to provide the spatial power-combining device with reduced weight while maintaining good thermal dissipation for heat generated by the amplifiers. In certain embodiments, the body structure may comprise an allotrope of carbon such as graphite or graphene, among others. In certain embodiments, the body structure may include one or more thermal vias configured to dissipate heat from the amplifier.

22 Claims, 5 Drawing Sheets

(56) References Cited

U.S. PATENT DOCUMENTS

| | | | |
|---|---|---|---|
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 | 12/2008 | Rector |
| 8,698,577 | B2 | 4/2014 | Sherrer et al. |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. |
| 9,293,801 | B2 | 3/2016 | Courtney et al. |
| 9,325,074 | B2 * | 4/2016 | Chandler ............... H01Q 23/00 |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2014/0145794 | A1 | 5/2014 | Courtney et al. |
| 2014/0145795 | A1 | 5/2014 | Behan et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |

OTHER PUBLICATIONS

Non-Final Office Action for U.S. Appl. No. 15/981,516, dated Jul. 17, 2019, 5 pages.

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 122-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Bathe TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul 17-22, San Francisco, California, American Society of Mechanical Engineers, 11 pages.

Notice of Allowance for U.S. Appl. No. 15/637,472, dated Mar. 12, 2019, 7 pages.

Non-Final Office Action for U.S. Appl. No. 15/846,840, dated Mar. 21, 2019, 4 pages.

Notice of Allowance for U.S. Appl. No. 15/845,225, dated Jan. 10, 2019, 7 pages.

Notice of Allowance for U.S. Appl. No. 16/166,548, dated Nov. 29, 2018, 8 pages.

Non-Final Office Action for U.S. Appl. No. 15/933,783, dated May 1, 2019, 8 pages.

Non-Final Office Action for U.S. Appl. No. 16/042,351, dated Jul. 5, 2019, 5 pages.

Notice of Allowance for U.S. Appl. No. 15/846,840, dated Jul. 5, 2019, 7 pages.

Non-Final Office Action for U.S. Appl. No. 15/981,535, dated Jul. 8, 2019, 5 pages.

Non-Final Office Action for U.S. Appl. No. 16/005,794, dated Oct. 7, 2019, 11 pages.

Notice of Allowance for U.S. Appl. No. 16/042,351, dated Nov. 18, 2019, 7 pages.

Non-Final Office Action for U.S. Appl. No. 16/008,586, dated Oct. 24, 2019, 10 pages.

Corrected Notice of Allowance and Examiner-Initiated Interview Summary for U.S. Appl. No. 15/846,840, dated Dec. 12, 2019, 6 pages.

Notice of Allowance for U.S. Appl. No. 16/005,794, dated Jan. 9, 2020, 7 pages.

(56) References Cited

OTHER PUBLICATIONS

Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 15/981,516, dated Jan. 15, 2020, 7 pages.
Espera Jr., A.H. et al., "3D-printing and advanced manufacturing for electronics," Progress in Additive Manufacturing, Feb. 4, 2019, Springer, 24 pages.
Glasschroeder, J. et al., "Powder-bed-based 3D-printing of function integrated parts," Rapid Prototyping Journal, vol. 21, Issue 2, Emerald Group Publishing Limited, pp. 207-215.
Leigh, S.J. et al., "A Simple, Low-Cost Conductive Composite Material for 3D Printing of Electronic Sensors," PLoS One, vol. 7, Issue 11, Nov. 2012, 6 pages.
Sames, W.J. et al., "The Metallurgy and Processing Science of Metal Additive Manufacturing," 2016, available at https://www.osti.gov/servlets/purl/1267051, 76 pages.
Corrected Notice of Allowability and Examiner-Initiated Interview Summary for U.S. Appl. No. 16/005,794, dated May 26, 2020, 6 pages.
Notice of Allowance for U.S. Appl. No. 16/032,252, dated Jun. 1, 2020, 7 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Non-Final Office Action for U.S. Appl. No. 16/284,214, dated Aug. 20, 2020, 5 pages.

* cited by examiner

STRUCTURES FOR SPATIAL POWER-COMBINING DEVICES

FIELD OF THE DISCLOSURE

The disclosure relates generally to spatial power-combining devices and, more particularly, to improved structures for spatial power-combining devices.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures are related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges. Additional size and structural considerations for spatial power-combining devices involve providing good thermal management for heat generated during amplification.

The art continues to seek improved spatial power-combining devices having improved mechanical properties and good operating performance while being capable of overcoming challenges associated with conventional devices.

SUMMARY

Aspects disclosed herein relate to improved structures for spatial power-combining devices. A spatial power-combining device includes a plurality of amplifier assemblies and each amplifier assembly includes a body structure that supports an input antenna structure, an amplifier, and an output antenna structure. According to embodiments disclosed herein, the body structure comprises a material that is configured to provide the spatial power-combining device with reduced weight while maintaining good thermal dissipation for heat generated by the amplifiers. In certain embodiments, the body structure may comprise an allotrope of carbon such as graphite or graphene, among others. In certain embodiments, the body structure may include one or more thermal vias configured to dissipate heat from the amplifier.

In one aspect, a spatial power-combining device for modifying a signal comprises a plurality of amplifier assemblies, wherein each amplifier assembly of the plurality of amplifier assemblies comprises: an amplifier; an input antenna structure and an output antenna structure; and a body structure that is configured to support the amplifier, the input antenna structure, and the output antenna structure, wherein the body structure comprises an allotrope of carbon. In certain embodiments, the allotrope of carbon may comprise graphite. The body structure may comprise an electrically conductive film on the graphite. In certain embodiments, the electrically conductive film comprises at least one of plated nickel or copper. The graphite may comprise a dopant that is configured to improve mechanical stability or improve electrical conductivity. In certain embodiments, the allotrope of carbon comprises at least one of graphene, a coating comprising fullerenes, or a coating comprising carbon nanotubes. The spatial power-combining device may further comprise: an input coaxial waveguide section configured to concurrently provide a signal to the input antenna structure of each amplifier assembly of the plurality of amplifier assemblies; and an output coaxial waveguide section configured to concurrently combine a signal from the output antenna structure of each amplifier assembly of the plurality of amplifier assemblies. The input antenna structure may further comprise: a substrate comprising a first face and a second face that opposes the first face; and an input signal conductor on the first face and an input ground conductor on the second face. The spatial power-combining device may further comprise an input port for receiving a signal and an output port for transmitting an amplified signal. In certain embodiments, the plurality of amplifier assemblies are arranged radially around a center axis of the spatial power-combining device. The amplifier of each amplifier assembly comprises a monolithic microwave integrated circuit (MMIC) amplifier. The spatial power-combining device may further comprise a heat transfer device that is arranged to at least partially surround each amplifier assembly of the plurality of amplifier assemblies.

In another aspect, a spatial power-combining device for modifying a signal comprises a plurality of amplifier assemblies, wherein each amplifier assembly of the plurality of amplifier assemblies comprises: an amplifier; an input antenna structure and an output antenna structure; and a body structure that is configured to support the amplifier, wherein the body structure comprises one or more thermal vias that are configured to dissipate heat from the amplifier. In certain embodiments, the one or more thermal vias are configured to dissipate heat from the amplifier in a direction perpendicular to a surface on which the amplifier is mounted. In certain embodiments, the one or more thermal vias extend partially through the body structure. In certain embodiments, the one or more thermal vias extend entirely through the body structure. The body structure may comprise an anisotropic heat spreader configured to dissipate heat away from the one or more thermal vias. In certain embodiments, the anisotropic heat spreader comprises graphite. The body structure may further comprise an electrically conductive film on the graphite. The electrically conductive film may comprise comprises plated nickel or copper.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
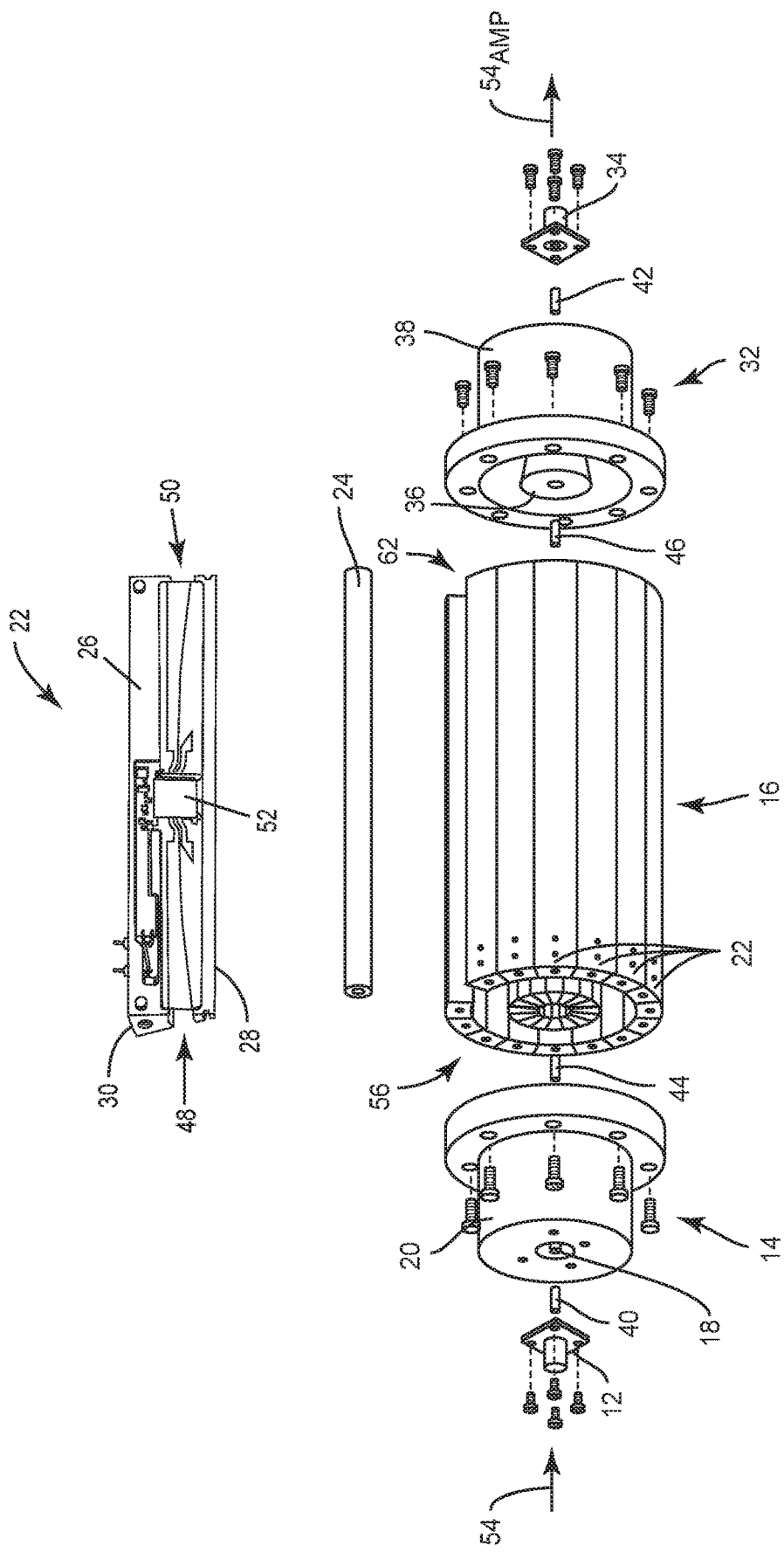
FIG. 1 is a partially-exploded perspective view of a spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to improved structures for spatial power-combining devices. A spatial power-combining device includes a plurality of amplifier assemblies, and each amplifier assembly includes a body structure that supports an input antenna structure, an amplifier, and an output antenna structure. According to embodiments disclosed herein, the body structure comprises a material that is configured to provide the spatial power-combining device with reduced weight while maintaining good thermal dissipation for heat generated by the amplifiers. In certain embodiments, the body structure may comprise an allotrope of carbon such as graphite or graphene, among others. In certain embodiments, the body structure may include one or more thermal vias configured to dissipate heat from the amplifier.

The embodiments are particularly adapted to spatial power-combining devices that operate at microwave frequencies such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of 2 GHz to 20 GHz.

A spatial power-combining device generally includes a plurality of amplifier assemblies, and each amplifier assembly is an individual signal path and includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies are typically arranged coaxially about a center axis. Accordingly, the spatial power-combining device is configured to split, amplify, and combine an electromagnetic signal.

FIG. 1 is a partially-exploded perspective view of a spatial power-combining device 10. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 includes an inner conductor 18 and an outer conductor 20 that radially surrounds the inner conductor 18, thereby forming an opening therebetween. Outer surfaces of the inner conductor 18 and an inner surface of the outer conductor 20 have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. In certain embodiments, a center post 24 is provided at the center axis for mechanical support and the plurality of amplifier assemblies 22 may be positioned circumferentially around the center post 24. In other embodiments, the center post 24 may be omitted. In FIG. 1, the center post 24 is illustrated in an exploded manner. Each amplifier assembly 22 comprises a body structure 26 having a predetermined wedge-shaped cross-section, an inner surface 28, and an arcuate outer surface 30. When the amplifier assemblies 22 are collectively assembled radially about the center axis, they form the center waveguide section 16 with a generally cylindrical shape; however, other shapes are possible, such as rectangular, oval, or other geometric shapes.

The spatial power-combining device 10 also comprises an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 GHz, the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 includes an inner conductor 36 and an outer conductor 38 that radially surrounds the inner conductor 36, thereby forming an opening therebetween. Outer surfaces of the inner conductor 36 and an inner surface of the outer conductor 38 have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. In certain embodiments, the center post 24 connects with the inner conductors 18, 36 by way of screws 44, 46 on opposite ends of the center post 24. The center post 24 is provided for simplifying mechanical connections, may have other than a cylindrical shape, and may be omitted altogether.

Each amplifier assembly 22 comprises an input antenna structure 48 and an output antenna structure 50, both of which are coupled to an amplifier 52. In some embodiments, the amplifier 52 comprises a monolithic microwave integrated circuit (MMIC) amplifier. A MMIC may be a solid-state gallium nitride (GaN) based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates between the inner conductor 18 and the outer conductor 20 and concurrently provides the input signal 54 to the center waveguide section 16. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The plurality of output antenna structures 50 forms an output antenna array 62 that operates to provide the amplified signal portions to be concurrently combined inside the opening of the output coaxial waveguide section 32 to form an amplified output signal $54_{AMP}$, which is then propagated through the output coaxial waveguide section 32 to the output port 34.

Figure 2:
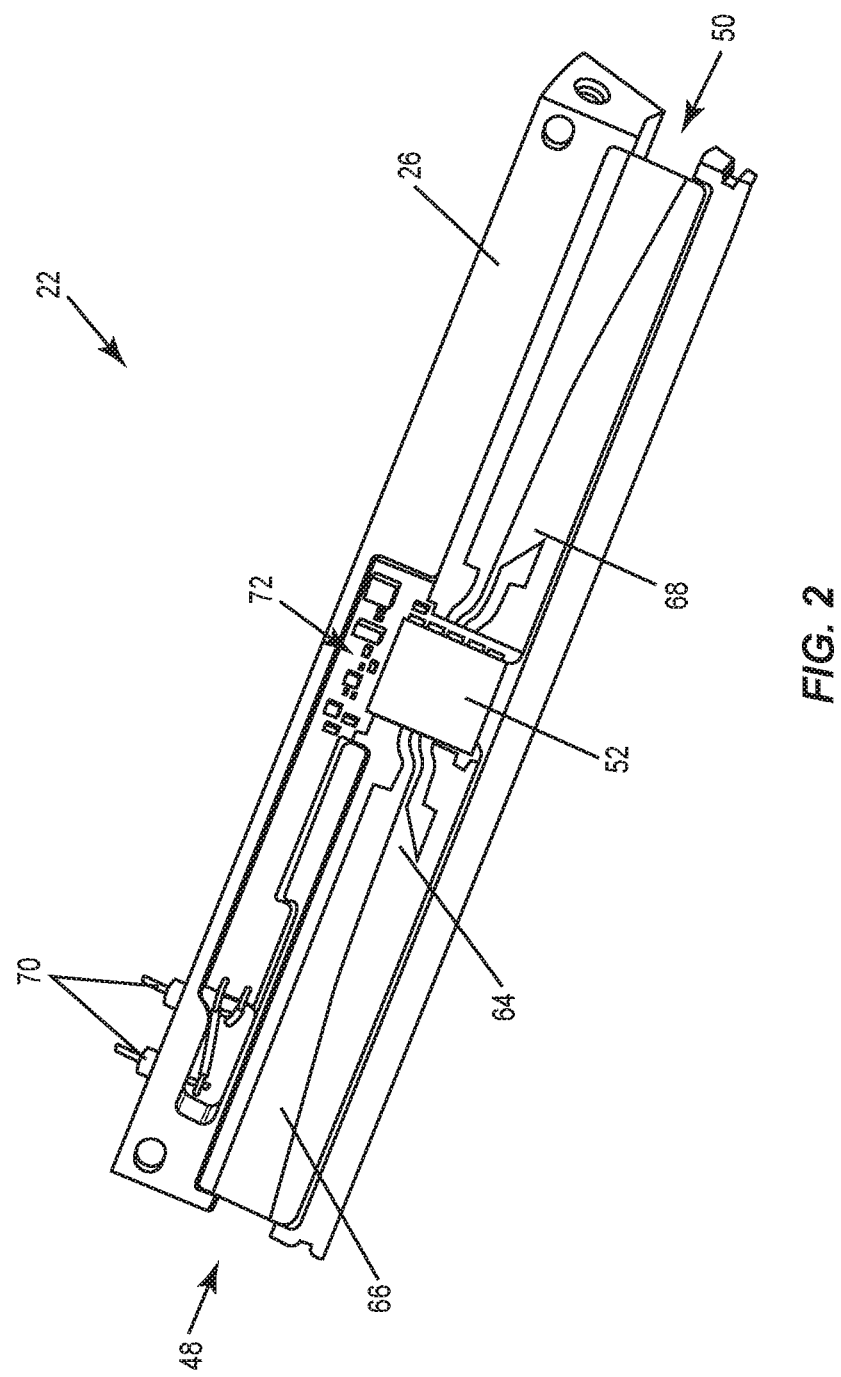
FIG. 2 is a perspective view of an individual amplifier assembly of FIG. 1 according to embodiments disclosed herein.

FIG. 2 is a perspective view of an individual amplifier assembly 22 of FIG. 1 according to embodiments disclosed herein. The input antenna structure 48 comprises an input signal conductor 64 supported on a first face of a substrate 66 or board, and the output antenna structure 50 comprises an output signal conductor 68 that is also supported on the first face of the substrate 66. The input signal conductor 64 and the output signal conductor 68 are electromagnetically coupled to the amplifier 52. The substrate 66 may be a printed circuit board that provides a desired form factor and mechanical support for the input signal conductor 64 and the output signal conductor 68. The input antenna structure 48 also includes an input ground conductor (not visible) on an opposing side of the substrate 66 to the input signal conductor 64. In a similar manner, the output antenna structure 50 includes an output ground conductor (not visible) on an opposing side of the substrate 66 to the output signal conductor 68. In other embodiments, the substrate 66 may be substituted with a plurality of substrates or boards. In still other embodiments, the input signal conductor 64, the input ground conductor (not visible), the output signal conductor 68, and the output ground conductor (not visible) are mechanically supported by the body structure 26 such that the substrate 66 may not be present. In certain embodiments, one or more ports 70 are provided for an external voltage input, such as from a direct current voltage source, and corresponding bias circuitry 72 is provided to control the amplifier 52. In certain embodiments, the bias circuitry 72 is arranged on the same substrate 66 as the antenna structures 48, 50. In other embodiments, a separate substrate may be provided for the bias circuitry 72.

In operation, a portion of the input signal (54 in FIG. 1) is received by the input antenna structure 48 where it radiates between the input signal conductor 64 and the input ground conductor (not visible) and propagates to the amplifier 52 for amplification. For embodiments with a board 66, the portion of the input signal (54 in FIG. 1) radiates between the input signal conductor 64 and the input ground conductor (not visible) through the board 66. For embodiments without a board 66, the portion of the input signal (54 in FIG. 1) radiates between the input signal conductor 64 and the input ground conductor (not visible) through air. The amplifier 52 outputs a portion of the amplified signal ($54_{AMP}$ in FIG. 1) to the output antenna structure 50 where it radiates between the output signal conductor 68 and the output ground conductor (not visible) in a similar manner.

Turning back to FIG. 1, the spatial power-combining device 10 is typically utilized for high power-combining applications. Accordingly, the amplifier 52 in each of the amplifier assemblies 22 is configured for high power amplification, and may therefore generate a high amount of heat. If the operating temperature of each amplifier 52 increases too much, the performance and lifetime of each amplifier 52 may suffer. As previously described, the plurality of amplifier assemblies 22 form the center waveguide section 16. In this regard, thermal management is needed to effectively dissipate heat in and around the center waveguide section 16. Accordingly, the body structure 26 of each amplifier assembly 22 may typically comprise a thermally conductive material, such as copper (Cu), aluminum (Al), or alloys thereof that are configured to dissipate enough heat from the amplifier 52 to maintain a suitably low operating temperature. While beneficial for thermal management, the use of such metals or metal alloys may add extra weight to spatial power-combining devices, particularly those devices with larger sizes.

In certain embodiments, the body structure 26 of each amplifier assembly 22 may be configured to provide the spatial power-combining device 10 with reduced weight while maintaining good thermal dissipation for heat generated by the amplifiers. In certain embodiments, the body structure 26 comprises an allotrope of carbon. Allotropes of carbon may include one or more combinations of graphite, diamond, graphene, fullerenes, and carbon nanotubes, among others. In certain embodiments, the body structure 26 may comprise machined graphite that forms the shape of the body structure 26. Machining of graphite materials may be accomplished by various manufacturing techniques, including but not limited to electrical discharge machining (EDM). For the same body structure 26, graphite may reduce an overall weight of the body structure 26 in a range of two to six times lower when compared to Cu, Al, or alloys thereof. In certain embodiments, the body structure 26 may comprise a material having a density that is less than about 2 grams per cubic centimeter ($g/cm^3$). For example, a graphite material may have a density in a range from about 1.1 $g/cm^3$ to about 1.7 $g/cm^3$. In certain embodiments, the body structure 26 comprises a material that is an anisotropic heat spreader, such as graphite, that has high thermal conductivity in certain directions or planes and relatively low thermal conductivity in others. In this regard, the body structure 26 may comprise an anisotropic heat spreader, such as graphite that is configured to spread heat preferentially in one or more directions away from the amplifier 52. Additionally, graphite materials may provide improved corrosion resistance over conventional materials of Cu, Al, or alloys thereof. For embodiments where the body structure 26 comprises graphite, specific corrosion resistant coatings that are commonly used for Cu, Al, or alloys thereof may not be needed.

In certain embodiments, the body structure 26 may comprise graphite that has been coated with an electrically conductive film. In this regard, the graphite may provide reduced weight and good thermal management and the electrically conductive film provides the body structure 26 with electrically conductive surfaces configured to handle electromagnetic signals that propagate through the spatial power-combing device 10. In certain embodiments, the electrically conductive film comprises nickel (Ni), Cu, or combinations thereof. The Ni or Cu may be coated or otherwise formed on the graphite material by an electroless plating process or other deposition techniques. In other embodiments, the body structure 26 comprises a graphite material that has sufficient electrical conductivity to handle electromagnetic signals that propagate through the spatial power-combining device 10. To enhance one or more properties of the graphite material, the graphite may comprise one or more dopants that may improve mechanical stability or improve electrical conductivity. The dopants may include iron (Fe), magnesium (Mg), boron (B), and phosphorus (P), among others. In certain embodiments, the body structure 26 may include a graphene material or a coating of graphene material. In other embodiments, the body structure 26 may include a coating that comprises fullerenes or carbon nanotubes.

Figure 3:
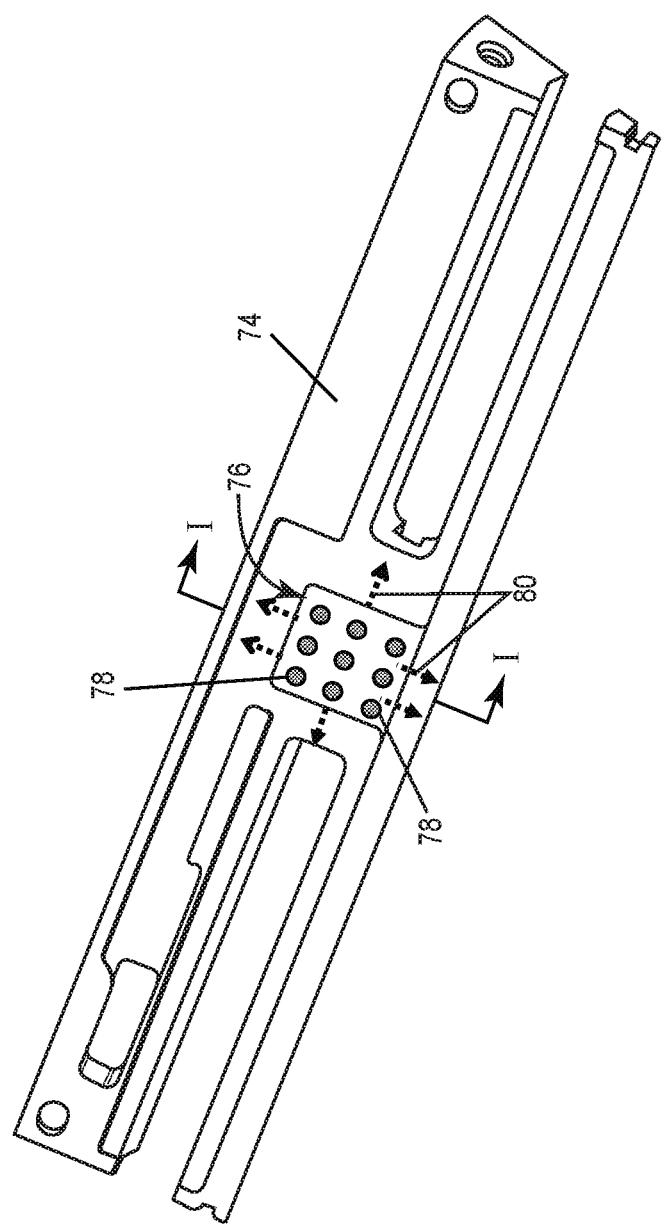
FIG. 3 is a perspective view of a body structure of an individual amplifier assembly according to embodiments disclosed herein.

FIG. 3 is a perspective view of a body structure 74 of an individual amplifier assembly according to embodiments disclosed herein. In FIG. 3, the substrate (66 of FIG. 2), amplifier (52 of FIG. 2), and bias circuitry (72 of FIG. 2), among others have all been omitted. The body structure 74 includes a surface 76 on which an amplifier will be mounted or otherwise arranged. As previously described, during operation, amplifiers generate heat within amplifier assemblies of spatial power-combining devices. Accordingly, the surface 76 of the body structure 74 is arranged in closest proximity to a heat generating amplifier after assembly. In certain embodiments, the body structure 74 comprises one or more thermal vias 78 to dissipate heat from the amplifier during operation. The one or more thermal vias 78 may be arranged to extend into the body structure 74 from the surface 76. In this regard the one or more thermal vias 78 are configured to dissipate heat away from the surface 76 on which the amplifier will be mounted or otherwise arranged. In certain embodiments, the body structure 74 comprises a material that is an anisotropic heat spreader as previously described. In this regard, the anisotropic heat spreader may be configured to preferentially spread head laterally away from the surface 76 as indicated by various dashed-line arrows 80 in FIG. 3. Accordingly, the material of the body structure 74 may be configured to spread or dissipate heat laterally across the body structure 74 and away from the one or more thermal vias 78, while the one or more thermal vias 78 are configured to further spread or dissipate heat into or through the body structure 74.

Figure 4:
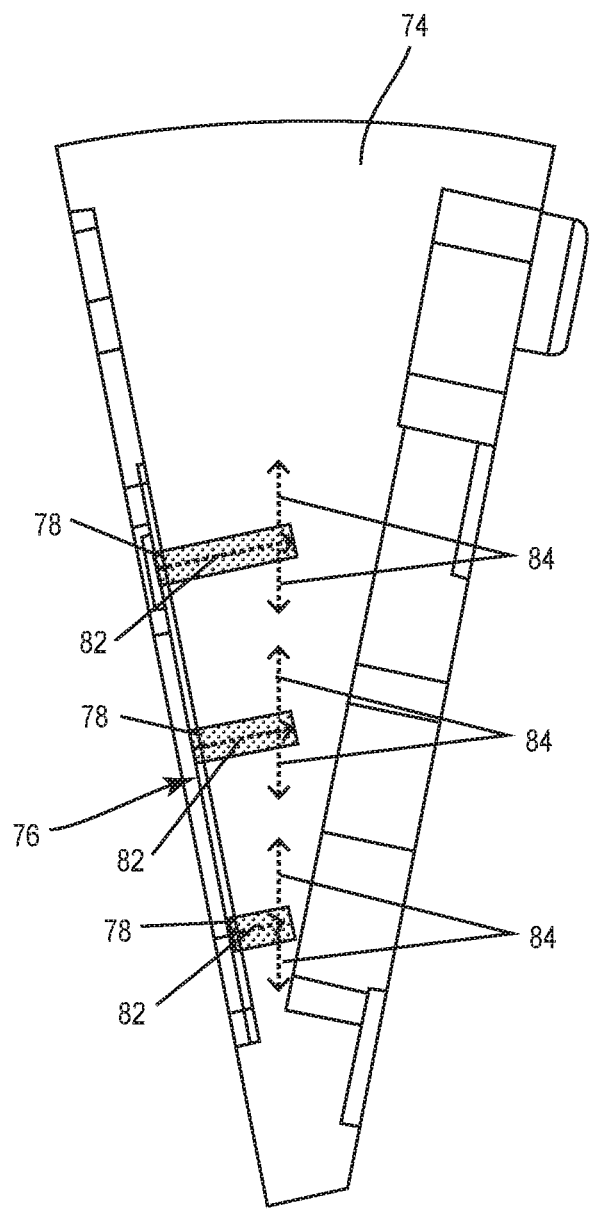
FIG. 4 represents a cross-section of the body structure taken along section line I-I of FIG. 3.

FIG. 4 represents a cross-section of the body structure 74 taken along section line I-I of FIG. 3. As illustrated, the one or more thermal vias 78 are configured to extend from the surface 76 on which the amplifier will be mounted or otherwise arranged into the body structure 74. In certain embodiments, the one or more thermal vias 78 are arranged to extend in a direction that is perpendicular to the surface 76. In such embodiments, the one or more thermal vias 78 are configured to dissipate heat from the amplifier in a direction perpendicular to the surface 76 on which the amplifier is mounted as indicated by the dashed-line arrows 82. In other embodiments, the one or more thermal vias 78 may extend into the body structure 74 in a non-perpendicular direction. As illustrated in FIG. 4, the one or more thermal vias 78 are configured to extend at least partially through the body structure 74. As heat is spread or dissipated through the one or more thermal vias 78, the material of the body structure 74 may further spread or dissipate heat away from the one or more thermal vias 78 within the body structure 74 as indicated by the dashed-line arrows 84. As illustrated in FIG. 4, certain thermal vias 78 may extend into the body structure 74 with distances that are greater than other thermal vias 78. In certain embodiments, this may be related to the shape of the body structure 74. For example, in FIG. 4, the body structure 74 is generally wedge shaped and the thermal vias 78 are arranged to extend into the body structure with distances that are greater in thicker portions of the wedge shape. In other embodiments, thermal vias 78 that are arranged closest to the center of an amplifier may extend farther into the body structure 74 than other thermal vias 78 that are arranged closer to a perimeter of the amplifier. In certain embodiments, the one or more thermal vias 78 may be configured to extend entirely through the body structure 74.

Figure 5:
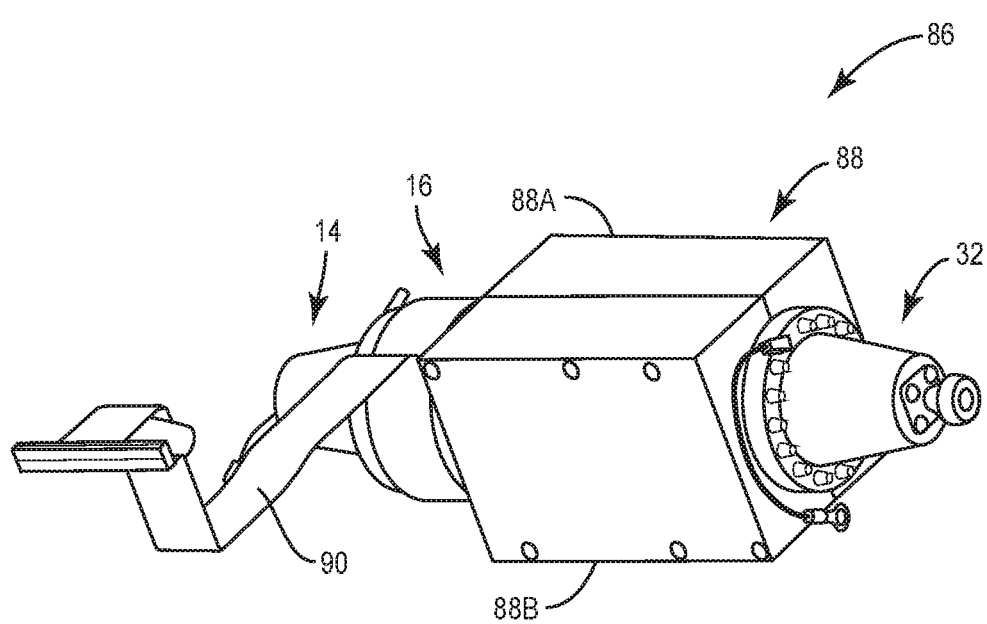
FIG. 5 is a perspective view of a spatial power-combining device that includes a heat transfer device according to embodiments disclosed herein.

FIG. 5 is a perspective view of a spatial power-combining device 86 that includes a heat transfer device 88 according to embodiments disclosed herein. The spatial power-combining device 86 is similar to the spatial power-combining device 10 of FIG. 1 and includes at least the input coaxial waveguide section 14, the center waveguide section 16, and the output coaxial waveguide section 32 as previously described. The heat transfer device 88 is arranged to at least partially surround the center waveguide section 16. In this manner, the heat transfer device 88 is arranged to at least partially surround the plurality of amplifier assemblies (22 of FIG. 1) of the center waveguide section 16. As illustrated in FIG. 5, the heat transfer device 88 may include a pair of separable halves 88A, 88B defining a cavity therebetween, the cavity having a shape which conforms to the outer shape of the center waveguide section 16. In certain embodiments, the heat transfer device 88 may comprise a solid thermally conductive material. In other embodiments, the heat transfer device 88 may include one or more fluid conduits within the body of the heat transfer device 88 to facilitate liquid cooling. The center waveguide section 16 includes a plurality of amplifier assemblies that have body structures as previously described. In this regard, the body structures may be configured to effectively spread heat laterally across the center waveguide section 16 and in turn laterally across the heat transfer device 88, thereby avoiding hot spots proximate to where the amplifiers are located within the spatial power-combining device 86. As further illustrated in FIG. 5, the spatial power-combining device 86 may further include electrical conductors 90 that are arranged to wrap around a portion of the center waveguide 16 that is not encompassed by the heat transfer device 88. In this regard, the electrical conductors 90 are configured to deliver a voltage input to the bias circuitry (72 of FIG. 2) in each amplifier assembly as previously described.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device for modifying a signal comprising a plurality of amplifier assemblies, wherein each amplifier assembly of the plurality of amplifier assemblies comprises:
   an amplifier;
   an input antenna structure and an output antenna structure that are arranged on a substrate; and
   a body structure that is configured to support the amplifier, the input antenna structure, the output antenna structure, and the substrate, wherein the body structure comprises an allotrope of carbon and one or more thermal vias that are arranged to extend at least partially through the allotrope of carbon.

2. The spatial power-combining device of claim 1, wherein the allotrope of carbon comprises graphite.

3. The spatial power-combining device of claim 2, wherein the body structure comprises an electrically conductive film on the graphite.

4. The spatial power-combining device of claim 3, wherein the electrically conductive film comprises at least one of plated nickel or copper.

5. The spatial power-combining device of claim 2, wherein the graphite comprises a dopant that is configured to improve mechanical stability or improve electrical conductivity.

6. The spatial power-combining device of claim 1, wherein the allotrope of carbon comprises at least one of graphene, a coating comprising fullerenes, or a coating comprising carbon nanotubes.

7. The spatial power-combining device of claim 1, further comprising:
   an input coaxial waveguide section configured to concurrently provide a signal to the input antenna structure of each amplifier assembly of the plurality of amplifier assemblies; and
   an output coaxial waveguide section configured to concurrently combine a signal from the output antenna structure of each amplifier assembly of the plurality of amplifier assemblies.

8. The spatial power-combining device of claim 1, wherein the input antenna structure further comprises:
   an input signal conductor on a first face of the substrate and an input ground conductor on a second face of the substrate that opposes the first face.

9. The spatial power-combining device of claim 1, further comprising an input port for receiving a signal and an output port for transmitting an amplified signal.

10. The spatial power-combining device of claim 1, wherein the plurality of amplifier assemblies is arranged radially around a center axis of the spatial power-combining device.

11. The spatial power-combining device of claim 1, wherein the amplifier comprises a monolithic microwave integrated circuit (MMIC) amplifier.

12. The spatial power-combining device of claim 1, further comprising a heat transfer device that is arranged to at least partially surround each amplifier assembly of the plurality of amplifier assemblies.

13. A spatial power-combining device for modifying a signal comprising a plurality of amplifier assemblies, wherein each amplifier assembly of the plurality of amplifier assemblies comprises:

an amplifier;

an input antenna structure and an output antenna structure that are arranged on a substrate; and a body structure that is configured to support the amplifier, the input antenna structure, the output antenna structure, and the substrate, wherein the body structure comprises one or more thermal vias that are configured to dissipate heat from the amplifier.

14. The spatial power-combining device of claim 13, wherein the one or more thermal vias are configured to dissipate heat from the amplifier in a direction perpendicular to a surface on which the amplifier is mounted.

15. The spatial power-combining device of claim 14, wherein the body structure comprises an anisotropic heat spreader configured to dissipate heat away from the one or more thermal vias.

16. The spatial power-combining device of claim 15, wherein the anisotropic heat spreader comprises graphite.

17. The spatial power-combining device of claim 16, wherein the body structure further comprises an electrically conductive film on the graphite.

18. The spatial power-combining device of claim 17, wherein the electrically conductive film comprises plated nickel.

19. The spatial power-combining device of claim 17, wherein the electrically conductive film comprises copper.

20. The spatial power-combining device of claim 13, wherein the one or more thermal vias extend partially through the body structure.

21. The spatial power-combining device of claim 13, wherein the one or more thermal vias extend entirely through the body structure.

22. The spatial power-combining device of claim 13, wherein the one or more thermal vias extend into the body structure with a distance that is greater than one or more other thermal vias that extend into the body structure.

* * * * *